United States Patent
Duong (10) Patent No.: US 7,692,101 B2
(45) Date of Patent: Apr. 6, 2010

(54) REDUCTION OF JITTER IN A SEMICONDUCTOR DEVICE BY CONTROLLING PRINTED CIRCUIT BOARD AND PACKAGE SUBSTRATE STACKUP

(75) Inventor: Anthony T. Duong, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/008,353

(22) Filed: Jan. 9, 2008

(65) Prior Publication Data
US 2009/0173520 A1 Jul. 9, 2009

(51) Int. Cl.
*H05K 1/00* (2006.01)

(52) U.S. Cl. .......................... 174/250; 174/262; 257/82

(58) Field of Classification Search .................. 174/250, 174/262; 257/82
See application file for complete search history.

(56) References Cited

U.S. PATENT DOCUMENTS

| | | | |
|---|---|---|---|
| 6,181,004 B1 | 1/2001 | Koontz et al. | |
| 6,518,516 B2 * | 2/2003 | Blackwell et al. | 174/262 |
| 6,777,802 B1 * | 8/2004 | Mora et al. | 257/691 |
| 2005/0093173 A1 * | 5/2005 | Miller et al. | 257/780 |
| 2005/0225955 A1 | 10/2005 | Grebenkemper et al. | |
| 2006/0065903 A1 * | 3/2006 | Sakurai et al. | 257/82 |
| 2006/0240594 A1 * | 10/2006 | Fraley et al. | 438/107 |

\* cited by examiner

*Primary Examiner*—Jinhee J Lee
*Assistant Examiner*—Andargie M Aychillhum
(74) *Attorney, Agent, or Firm*—Thomas A. Ward; John J. King; Thomas George (57) ABSTRACT

A model and method are provided for lowering device jitter by controlling the stackup of PCB planes so as to minimize inductance between a FPGA and PCB voltage planes for critical core voltages within the FPGA. Furthermore, a model and method are provided for lowering jitter by controlling the stackup of package substrate planes so as to minimize inductance between a die and substrate voltage planes for critical core voltages within the die.

17 Claims, 9 Drawing Sheets

FIG. 1
*Prior Art*

| # | Layer |
|---|---|
| 1 | Signal Plane 1 |
| 2 | Ground Plane |
| 3 | Signal Plane 2 |
| 4 | Ground Plane |
| 5 | Signal Plane 3 |
| 6 | Ground Plane |
| 7 | Signal Plane 4 |
| 8 | Ground Plane |
| 9 | Signal Plane 5 |
| 10 | Ground Plane |
| 11 | Vcc Supply Plane |
| 12 | Ground Plane |
| 13 | Vcc Supply Plane |
| 14 | Vcc Supply Plane |
| 15 | Ground Plane |
| 16 | Signal Plane 6 |
| 17 | Ground Plane |
| 18 | Signal Plane 7 |
| 19 | Ground Plane |
| 20 | Signal Plane 8 |
| 21 | Ground Plane |
| 22 | Signal Plane 9 |
| 23 | Ground Plane |
| 24 | Signal Plane 10 |

| # | |
|---|---|
| 1 | Signal Plane 1 |
| 2 | Ground Plane |
| 3 | Vcc - Primary Core Supply Plane |
| 4 | Ground Plane |
| 5 | Signal Plane 2 |
| 6 | Signal Plane 3 |
| 7 | Ground Plane |
| 8 | Vcc - Secondary Core Supply Plane |
| 9 | Signal Plane 4 |
| 10 | Signal Plane 5 |
| 11 | Ground Plane |
| 12 | Vcc - Lowest Voltage I/O Supply Plane |
| 13 | Signal Plane 6 |
| 14 | Signal Plane 7 |
| 15 | Ground Plane |
| 16 | Vcc - Higher Voltage I/O Supply Plane |
| 17 | Signal Plane 8 |
| 18 | Signal Plane 9 |
| 19 | Ground Plane |
| 20 | Vcc - Highest Voltage I/O Supply Plane |
| 21 | Ground Plane |
| 22 | Signal Plane 10 |

| | | | |
|---|---|---|---|
| 1 | Signal Plane | Vcc - Primary Core Supply Plane | Signal Plane |
| 2 | Ground Plane | | |
| 3 | Vcc - Primary Core Supply Plane | | |
| 4 | Ground Plane | | |
| 5 | Vcc - Secondary Core Supply Plane | | |
| 6 | Ground Plane | | |
| 7 | Vcc - I/O Supply Plane | | |
| 8 | Signal Plane | | |

FIG. 8

| | | | |
|---|---|---|---|
| 1 | Signal Plane | Vcc - Primary Core Supply Plane | Signal Plane |
| 2 | Ground Plane | | |
| 3 | Vcc - Primary Core Supply Plane | | |
| 4 | Ground Plane | | |
| 5 | Vcc - Secondary Core Supply Plane | | |
| 6 | Ground Plane | | |
| 7 | Vcc - Lowest Voltage I/O Supply Plane | | |
| 8 | Ground Plane | | |
| 9 | Vcc - Higher Voltage I/O Supply Plane | | |
| 10 | Signal Plane | | |

FIG. 9

| | |
|---|---|
| 1 | Signal Plane \| Vcc - Primary Core Supply Plane \| Signal Plane |
| 2 | Ground Plane |
| 3 | Vcc - Primary Core Supply Plane |
| 4 | Ground Plane |
| 5 | Vcc - Secondary Core Supply Plane |
| 6 | Ground Plane |
| 7 | Vcc - Lowest Voltage I/O Supply Plane |
| 8 | Vcc - Higher Voltage I/O Supply Plane |
| 9 | Ground Plane |
| 10 | Signal Plane |

FIG. 10

REDUCTION OF JITTER IN A SEMICONDUCTOR DEVICE BY CONTROLLING PRINTED CIRCUIT BOARD AND PACKAGE SUBSTRATE STACKUP

BACKGROUND

1. Technical Field

The present invention relates to printed circuit boards (PCBs) and package substrates, and more particularly to the reduction of jitter in a semiconductor device by controlling stackup.

2. Related Art

Programmable logic devices (PLDs) are a well-known type of integrated circuit (IC) that may be programmed by a user to perform specified logic functions. One type of PLD, the field programmable gate array (FPGA), typically includes an array of programmable tiles. These programmable tiles can include, for example, programmable input/output blocks (IOBs), configurable logic blocks (CLBs), dedicated random access memory blocks (BRAMs), multipliers, digital signal processing blocks (DSPs), processors, clock managers, delay lock loops (DLLs), and so forth. Notably, as used herein, "include" and "including" mean including without limitation.

One such FPGA is the Xilinx Virtex® FPGA available from Xilinx, Inc. of San Jose, Calif. 95124. A FPGA typically includes an array of CLBs surrounded by a ring of IOBs. The CLBs and IOBs are interconnected by a programmable interconnect structure. The CLBs, IOBs, and interconnect structure are typically programmed by loading a stream of configuration data into internal configuration memory cells that define how the CLBs, IOBs, and interconnect structure are configured. The configuration data may be read from an external memory, conventionally an external integrated circuit memory EEPROM, EPROM, PROM, or the like, though a computer may also be used to provide the data. The collective states of the individual memory cells then determine the function of the FPGA. FPGAs may include one or more embedded microprocessors. For example, a microprocessor may be located in an area reserved for it, generally referred to as a "processor block." The FPGA is attached to a printed circuit board (PCB) of a computer or other similar device.

Another type of PLD is the complex programmable logic device (CPLD). A CPLD includes two or more "function blocks" connected together and to input/output (I/O) resources by an interconnect switch matrix. Each function block of the CPLD includes a two-level AND/OR structure. For purposes of clarity, FPGAs are described below though other types of PLDs and semiconductor devices may be used.

Figure 1:
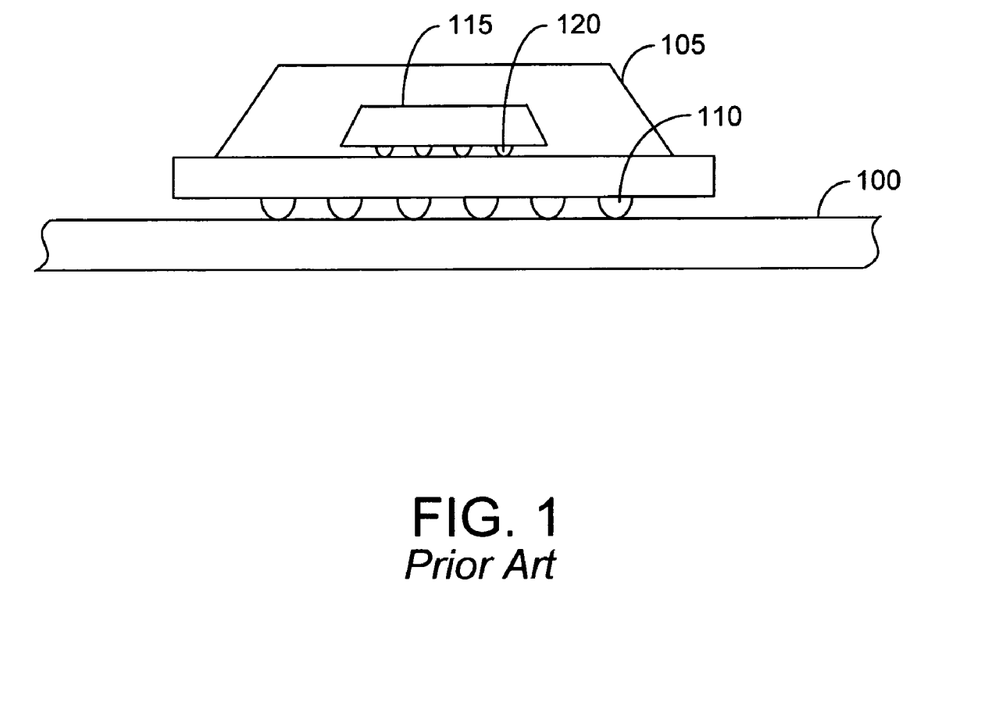
FIG. 1 shows an example PCB having mounted thereon an example FPGA.

FIG. 1 shows an example printed circuit board (PCB) 100 having mounted thereon an example FPGA chip 105. A plurality of contact members, for example metal pad regions or pogo pins (not shown), extend from the upper surface of PCB 100. The FPGA chip 105 has mounted thereon a plurality of solder balls 110 for electrically connecting to the contact members of the PCB 100. The FPGA chip 105 also includes die 115 electrically connected to a carrier via bumps 120. PCB 100 includes layers for power supply voltage rails, ground and signal lines (not shown). Vias connect these layers through solder balls 110 to and through the circuitry of the FPGA 105.

PCBs can contribute to jitter in FPGAs resulting from connections to the PCB layers while the PCB voltage supply drives circuitry of the FPGA. One factor contributing to jitter is local voltage supply noise in the PCB. Parasitic inductive, capacitive, and resistive loads along the lines supplying power and signals to elements in the FPGA can cause voltage fluctuations, including ground bounce and supply bounce, which increases local power supply noise in the PCB. This noise provided to delay elements creates jitter in the FPGA on a clock signal containing the delay elements.

Figure 2:
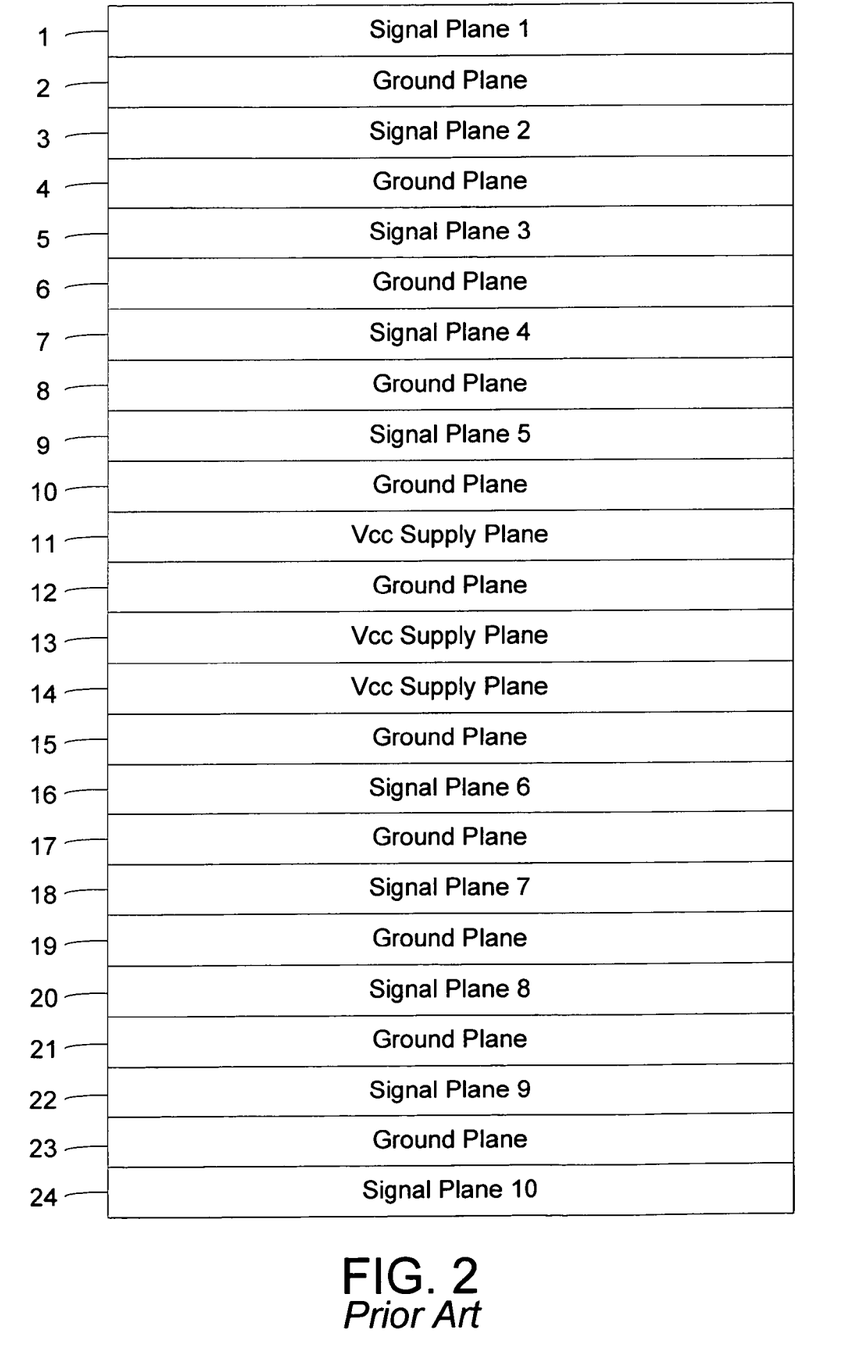
FIG. 2 shows a current example stackup for a twenty-four-layer PCB.

FIG. 2 shows a current example stackup for a twenty-four-layer PCB. This PCB 100 has three power supply planes 11, 13 and 14 and ten signal planes 1, 3, 5, 7, 9, 16, 18, 20, 22 and 24. This implementation places all the power supply planes 11, 13, and 14 in the middle of the board, without any particular rules assigned as to what order each power supply plane appears within the stackup. For example, the power supply planes can be differentiated due to their different voltages. As another example, some "core" power supply planes power timing-critical circuitry within the FPGA, whereas other power supply planes power input/output circuitry within the FPGA. Further, this stackup has two power supply planes 13 and 14 that are adjacent to each other, which allows noise from one plane to couple onto the other.

Figure 3:
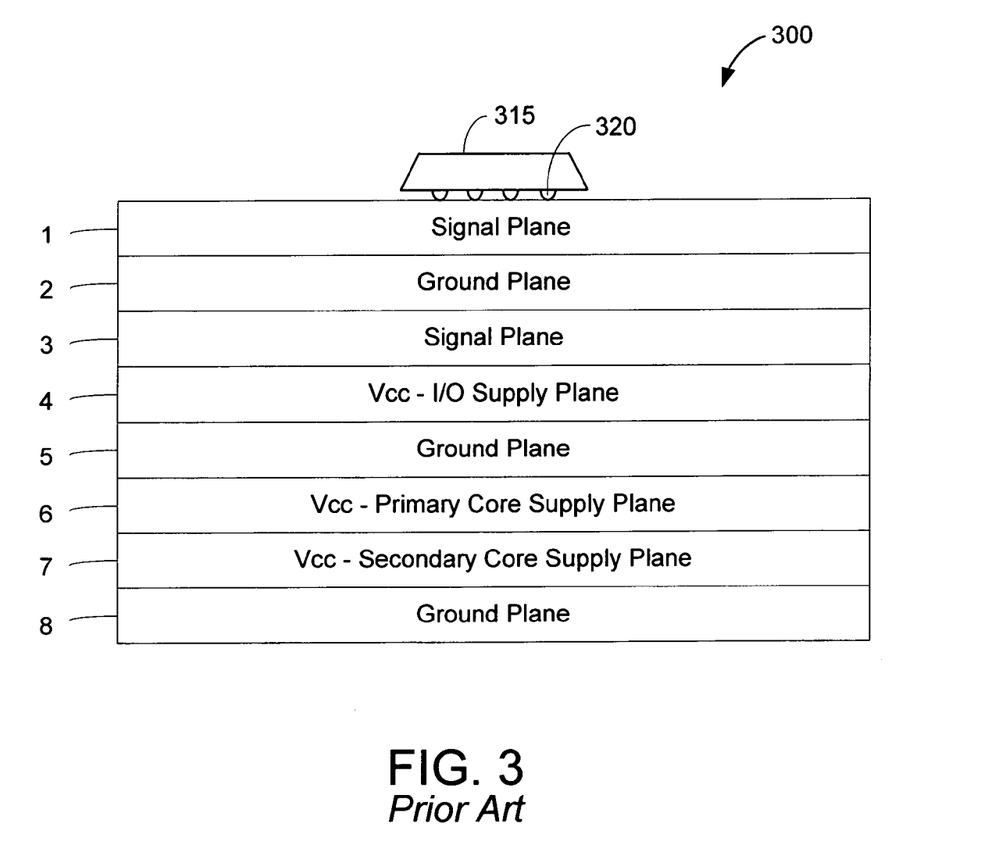
FIG. 3 shows a current example stackup for an eight-layer package substrate.

FIG. 3 shows a current example stackup for an eight-layer package substrate 300. The package substrate 300 is a PCB-like structure used to mount a silicon die. A die 315 is electrically connected to the package substrate 300 through conductive balls 320. Of note, the primary core supply, shown as "Vcc—Primary Core Supply Plane" on plane 6, and secondary core supply, shown as "Vcc—Secondary Core Supply Plane" on plane 7, are farther away from die 315 than the I/O power supply, shown as "Vcc—I/O Supply Plane on plane 4."

Figure 4:
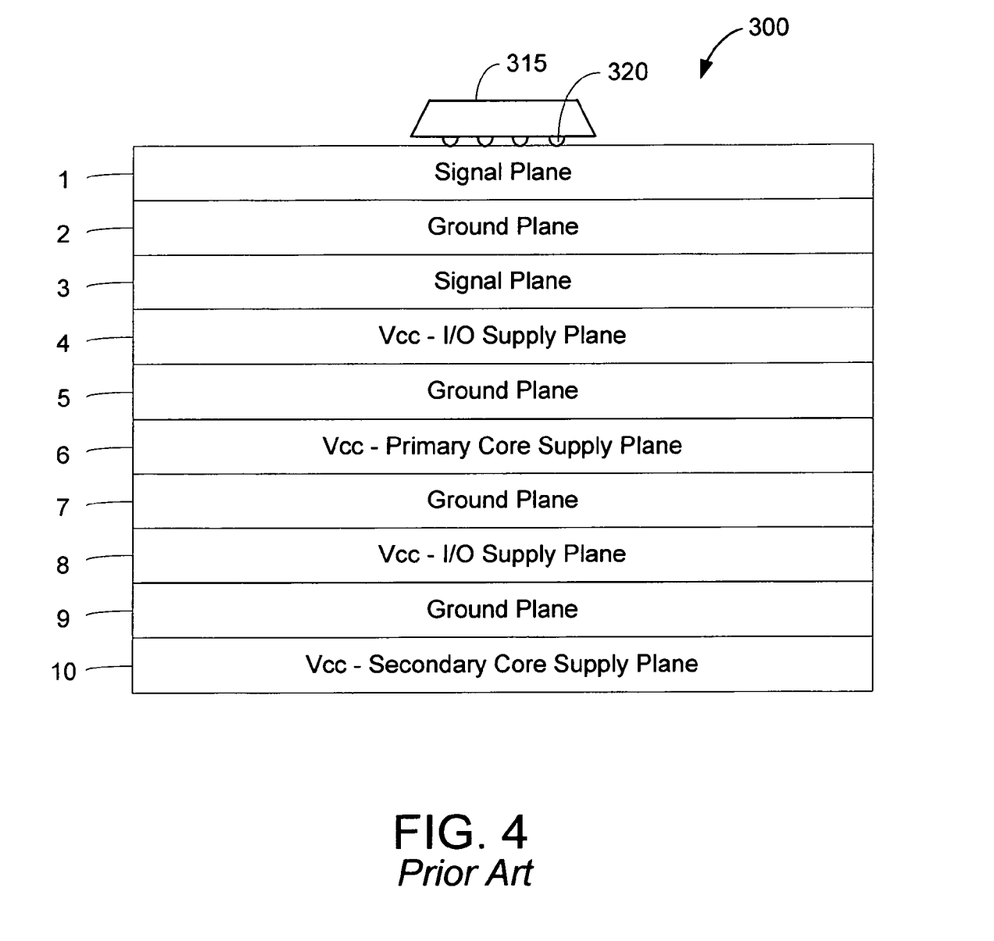
FIG. 4 shows a current example stackup for a ten-layer package substrate.

FIG. 4 shows a current example stackup for a ten-layer package substrate 300. Of note, the primary core power supply, shown as "Vcc—Primary Core Supply Plane" on plane 6 is farther away from die 315 than the first I/O power supply, shown as "Vcc—I/O Supply Plane" on plane 4. Similarly, the secondary core power supply, shown as "Vcc—Secondary Core Supply Plane" on plane 10, is farther away from the die 315 than both the first and second I/O power supply planes, shown as "Vcc—I/O Supply Plane" on planes 4 and 8.

It is desirable to reduce the amount of jitter on a clock as it propagates through a PCB to and through a silicon device, such as a FPGA.

SUMMARY

A model and method are provided for lowering device jitter by controlling the stackup of PCB planes so as to minimize inductance between a FPGA and PCB voltage planes for critical core voltages within the FPGA. Furthermore, a model and method are provided for lowering jitter by controlling the stackup of package substrate planes so as to minimize inductance between a die and substrate voltage planes for critical core voltages within the die.

BRIEF DESCRIPTION OF THE DRAWINGS

Further details of the present invention are explained with the help of the attached drawings in which.

DETAILED DESCRIPTION

Various embodiments of the present invention provide for reducing the amount of jitter on a clock as it propagates through a PCB to and through a silicon device, such as a FPGA. Jitter can be suppressed by minimizing the amount of ripple, both peak-to-peak amplitude and oscillation, present on the internal voltage rails that drive timing-critical circuitry on the FPGA. These voltage rails run through planes of the PCB to and through the FPGA. Examples of a FPGA's timing-critical circuitry are clock trees, delay lines, and digital clock management (DCM). These circuits operate on the primary core voltage. A clock tree distributes the system clock signal from a common point to all the elements of the system using the clock signal. A delay line is a transmission line or equivalent device, such as an analog delay line, used to delay a propagating signal. A delay line as described herein can also include a physical device such as a buffer used to provide a controlled delay between clock pulses. Delay lines can be used to synchronize clock signals used to clock various circuits. For example, delay lines may be used in a wide variety of digital clock management (DCM) circuits to adjust the skew between input and output clock signals.

Circuitry that operates on the secondary core voltage includes, but is not limited to, internal voltage regulators, band-gap, and bias voltages. Some small portions of the delay line and DCM circuitry also operate on this supply.

Circuitry that operates on the Input/Output (I/O) supplies includes input receivers and output drivers. The I/O supplies do not source any of the core circuitry such as clock trees, delay lines, or digital clock management (DCM).

Jitter is reduced by minimizing the amount of ripple and transient noise present on the voltage rails that drive timing-critical circuitry on the FPGA. In order to reduce noise on these voltage rails, inductance on these voltage rails must be reduced. In other words, the inductance between the FPGA and the voltage planes of the PCB for critical core voltages supplied to the FPGA must be reduced. The initial transient voltage caused by inductance on lines carrying voltages from power supply planes is governed by the following Eqn. 1:

$$V_L = L\frac{di}{dt}, \text{ where} \qquad \text{Eqn. 1}$$

$V_L$=inductor voltage
L=inductance, and
i=current.

From this equation, $V_L$ can be reduced by minimizing L. This is achieved by controlling the depth from the solder ball of the FPGA package to the supply planes on the PCB, which is governed by the following Eqn. 2:

$$L = 5.08d * ln\left(\frac{4d}{v}\right) - 0.75, \text{ where} \qquad \text{Eqn. 2}$$

d=the length from the ball to the plane and
v=the diameter of the break-out via

Since the equation for L is dictated primarily by d, it is imperative to control d to achieve optimal L. In semiconductor devices such as a FPGA, certain circuits are timing sensitive such that their performance and propagation hinge largely on the root-mean-square (RMS) voltage level and transient fluctuations that are present on the internal supply. By maintaining the RMS level and minimizing the transient fluctuations, the variability in delay of such circuit is reduced. Hence, jitter performance is enhanced by minimizing d.

Figure 5:
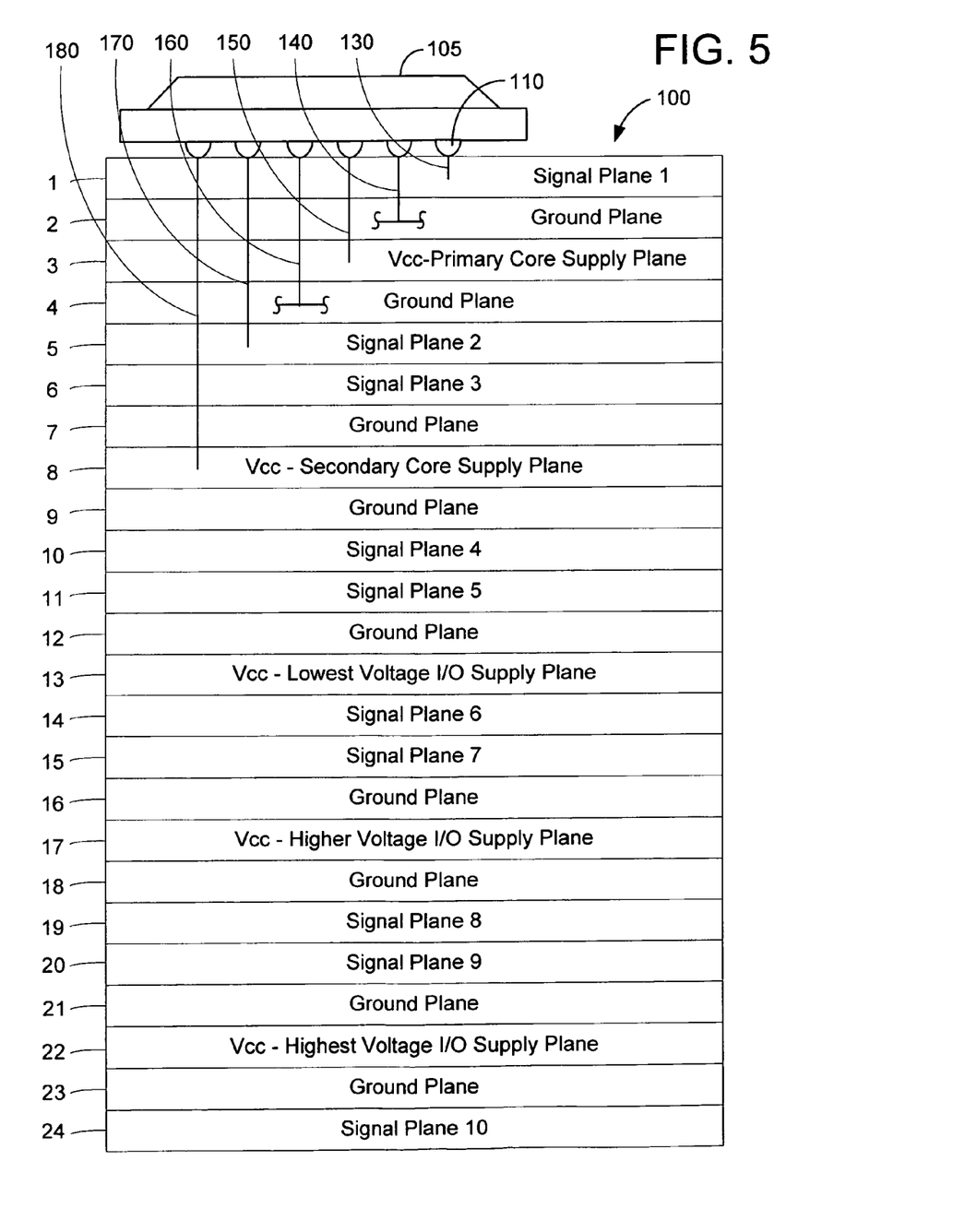
FIG. 5 shows an example controlled stackup for a twenty-four-layer PCB, according to embodiments of the present invention.

FIG. 5 shows an example controlled stackup of a twenty-four-layer PCB, according to embodiments of the present invention. PCB 100 is shown as having twenty-four different planes, labeled one through twenty-four. PCB 100 has ten signal planes. PCB 100 also has five supply planes, two more than the current twenty-four layer stackup shown in FIG. 2. The stackup of the planes of the PCB 100 is properly constrained to minimize the amount of jitter on a clock as it propagates to a FPGA 105 from the PCB 100. The FPGA 105 has solder balls 110 mounted thereon and is the same FPGA 105 as shown in FIG. 1. In embodiments described herein, devices other than FPGAs can be used including but not limited to other types of PLDs and other semiconductor devices.

In FIG. 5, the power, signal, and ground planes of the PCB 100 are connected to the FPGA 105 through power, signal, and ground lines that extend as vias from the PCB planes through the solder balls 110 to the circuitry of the FPGA 105. Conductive lines and vias making up power, signal, and ground lines include the power, signal, and ground planes. Only some of the power, signal, and ground planes are shown in FIG. 5 for clarity. For example, ground planes 2 and 4 are connected to the FPGA 105 through ground lines 140 and 160, respectively. Core supply planes 3 and 8 are connected to the FPGA 105 through power lines 150 and 180, respectively. Signal planes 1 and 5 are connected to the FPGA 105 through signal lines 130 and 170, respectively.

Regarding stackup of PCB planes, the following design rules apply.

First, all core supply planes are closer to the FPGA 105 than all I/O supply planes.

Next, as discussed above, the core supply planes are stacked in a particular order so as to minimize d, the length from the ball to particular ones of these core supply planes 3, and 8. The primary core supply voltage from the PCB that sources all timing-critical circuitry within the FPGA should be put on the voltage supply plane of the PCB that is closest to the FPGA. This minimizes d, the length from the ball 110 to the plane. The primary core supply voltage is shown as "Vcc—Primary Core Supply Plane" on plane 3.

The secondary core supply voltage from the PCB should be placed on the next available voltage supply plane of the PCB, followed by the tertiary core supply voltage, and so on. The example PCB 100 has a secondary and final core supply voltage, shown as "Vcc—Secondary Core Supply Plane" on plane 8. The example PCB 100 does not have any tertiary or other core supply voltages. In embodiments, PCB 100 can have one or more core supply planes.

Next, supply voltages from the PCB that drive strictly input/output (I/O) circuitry within the FPGA, and have no impact on the operation of timing-sensitive circuitry of the FPGA, should be placed on voltage supply planes of the PCB farther away from the FPGA. The supply with the largest voltage on the PCB should be placed farthest away from the FPGA. Because I/O standards sourced by larger supply voltages generally have more margin for noise, they can tolerate larger voltage fluctuations.

Three I/O supply planes are shown. The I/O supply plane supplying the largest voltage to FPGA 105 is farthest from the FPGA, and is shown as "Vcc—Highest Voltage I/O Supply Plane" on plane 22. The I/O supply plane supplying the next largest voltage to FPGA 105, is second farthest from the FPGA, and is shown as "Vcc—Higher Voltage I/O Supply Plane" on plane 17. The I/O supply plane supplying the lowest voltage to FPGA 105 is closest to the FPGA of the I/O supply planes, and is shown as "Vcc—Lowest Voltage I/O Supply Plane" on plane 13. In embodiments, PCB 100 can have one or more I/O supply planes.

Next, each of the supply planes 3, 8, 13, 17, and 22 is associated with at least one ground plane, as illustrated in FIG. 5. For example, supply plane 13 is associated with one ground plane 12, while the four supply planes 3, 8, 17, and 22 are associated with two ground planes 2 and 4, 7 and 8, 16 and 18, as well as 21 and 23, respectively.

Another rule for a controlled PCB stackup is that the second to last layer is a ground plane and the third to last layer is an I/O supply plane. In FIG. 5, for example, the second to last layer is ground plane 23, and the third to last layer is "Vcc—Highest Voltage I/O Supply Plane" on plane 22.

Figure 6:
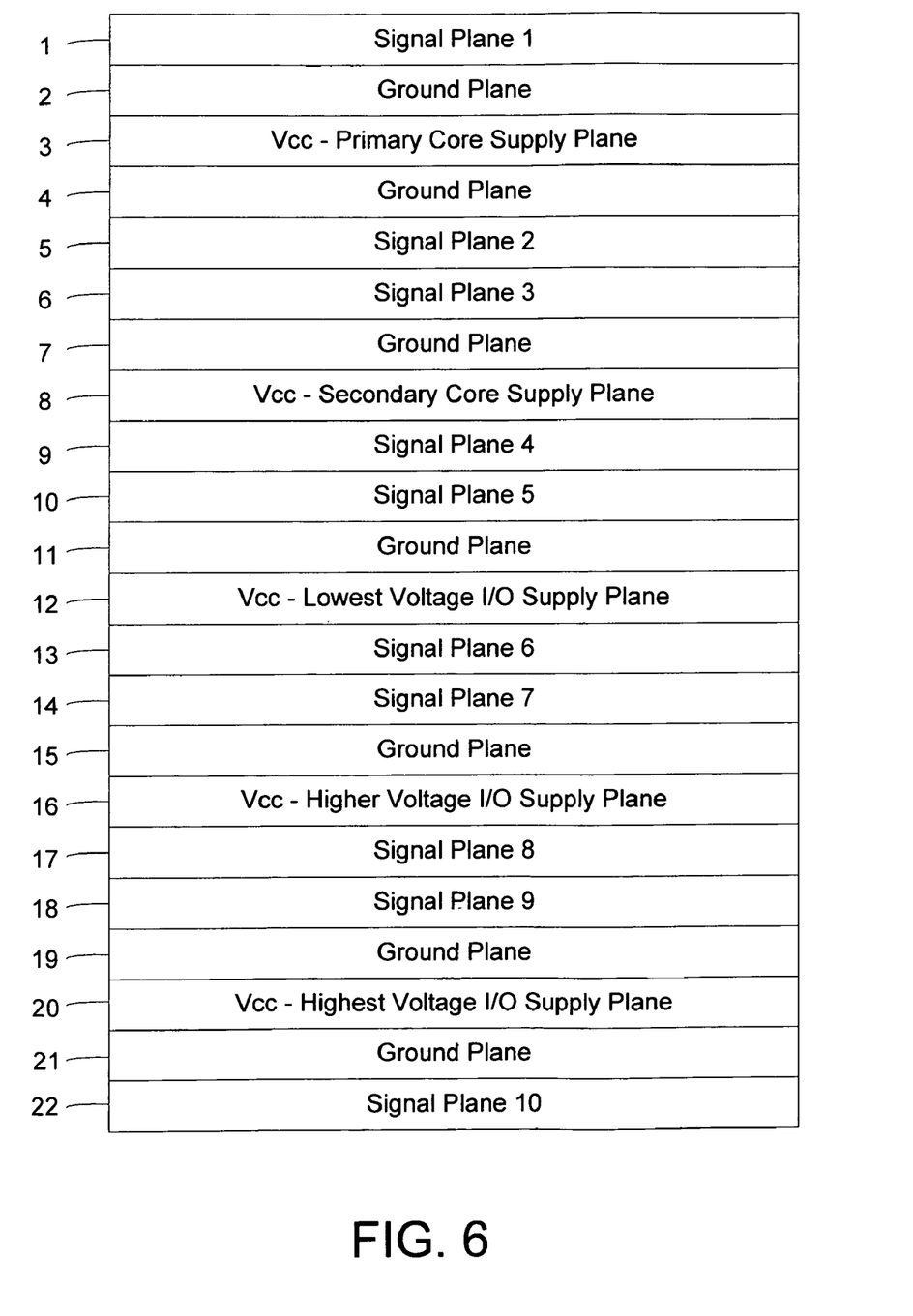
FIG. 6 shows an example controlled stackup for a twenty-two-layer PCB, according to embodiments of the present invention.

FIG. 6 shows an example controlled stackup for a twenty-two-layer PCB, according to embodiments of the present invention. There are five supply planes and ten signal planes as in FIG. 5. The number of planes, however, has been reduced by two ground planes. The rules as described above for FIG. 5 are used, and FIG. 5 is used as a starting point in order to reduce two ground planes. In FIG. 6, three supply planes 8, 12, and 16 are associated with one ground plane 7, 11, and 15, respectively. The two supply planes 3 and 20 are still associated with two ground planes 2 and 4, as well as 19 and 21, respectively.

Figure 7:
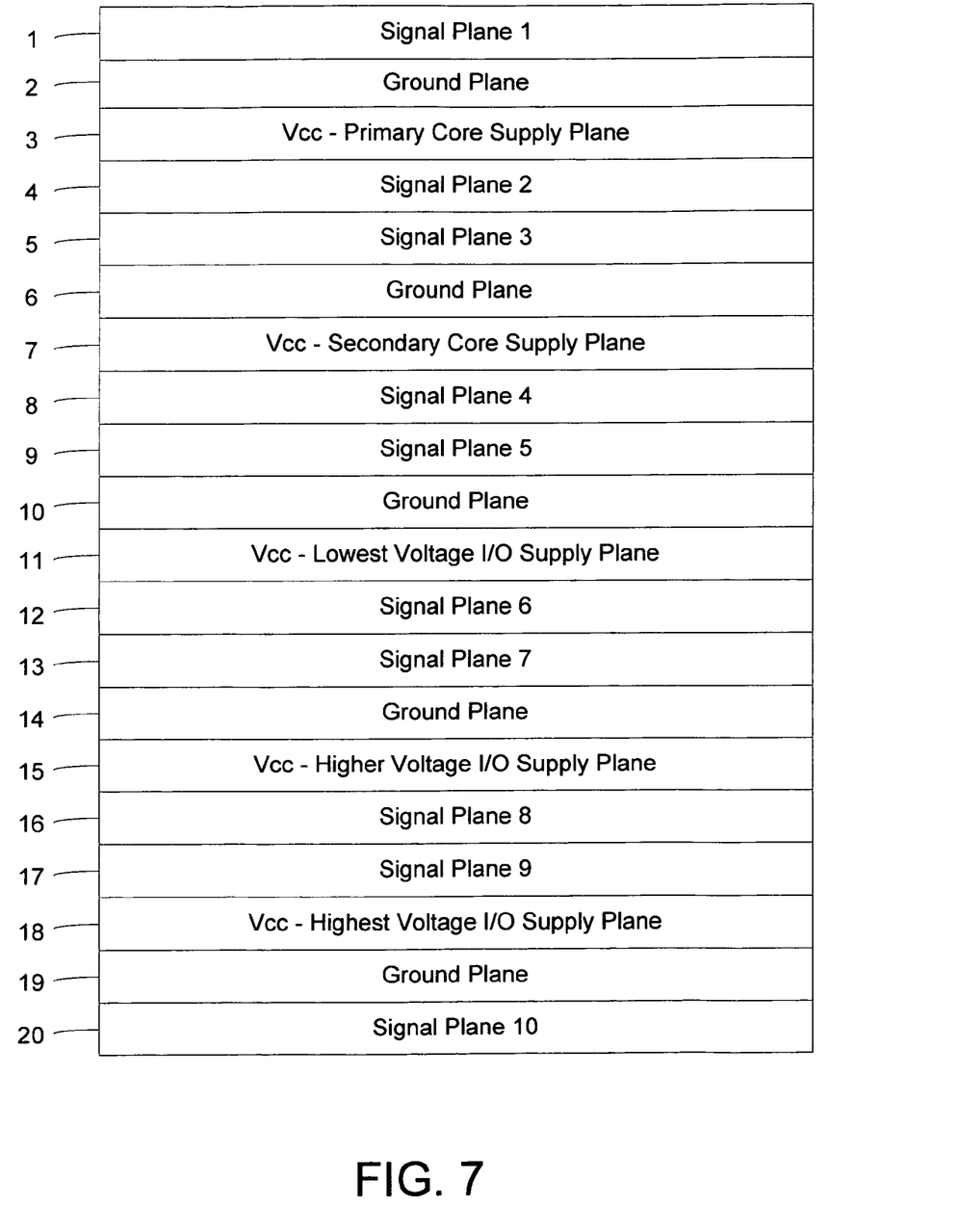
FIG. 7 shows an example controlled stackup for a twenty-layer PCB, according to embodiments of the present invention.

FIG. 7 shows an example controlled stackup for a twenty-layer PCB, according to embodiments of the present invention. There are five supply planes and ten signal planes as in FIG. 6. However, the number of planes has been reduced further by two ground planes. Thus, in FIG. 7, all five supply planes 3, 7, 11, 15 and 18 are associated with one ground plane 2, 6, 10, 14, and 19, respectively.

Figure 8:
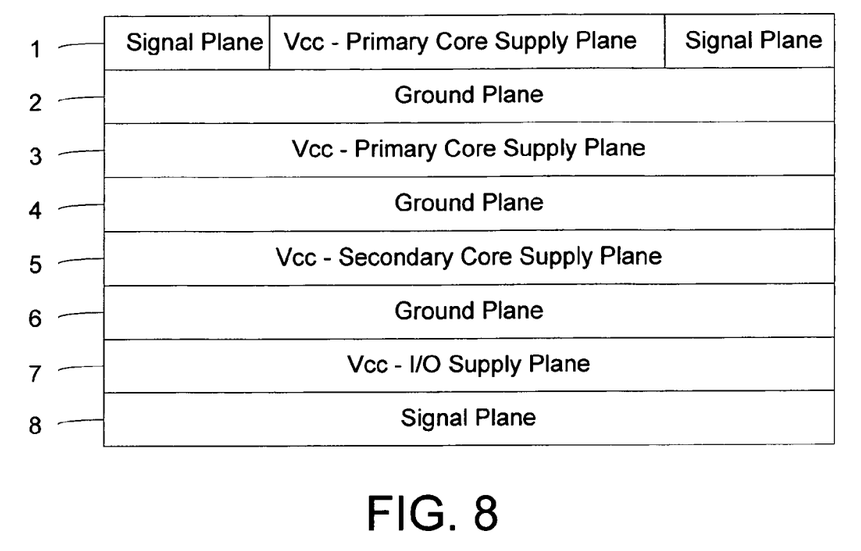
FIG. 8 shows an example controlled stackup for an eight-layer package substrate, according to embodiments of the present invention.

FIG. 8 shows an example controlled stackup for an eight-layer package substrate, according to embodiments of the present invention. A package substrate is a PCB-like structure used to mount a silicon die. One implementation shown in FIG. 8 shows that the main primary core supply plane, shown as "Vcc—Primary Core Supply Plane" on plane 3 is placed on the supply plane closest to a die (not shown). In addition, "Vcc—Primary Core Supply Plane" can be placed in part on plane 1 in portions not used for routing signals. Bringing the primary core supply plane to plane 1 further reduces inductance to the die. Further, both core supply planes, shown as "Vcc—Primary Core Supply Plane" on plane 3 and "Vcc—Secondary Core Supply Plane" on plane 5, are closer to the die than any I/O supply planes. In this implementation, there is only one I/O supply plane, shown as "Vcc—I/O Supply Plane" on plane 7.

Figure 9:
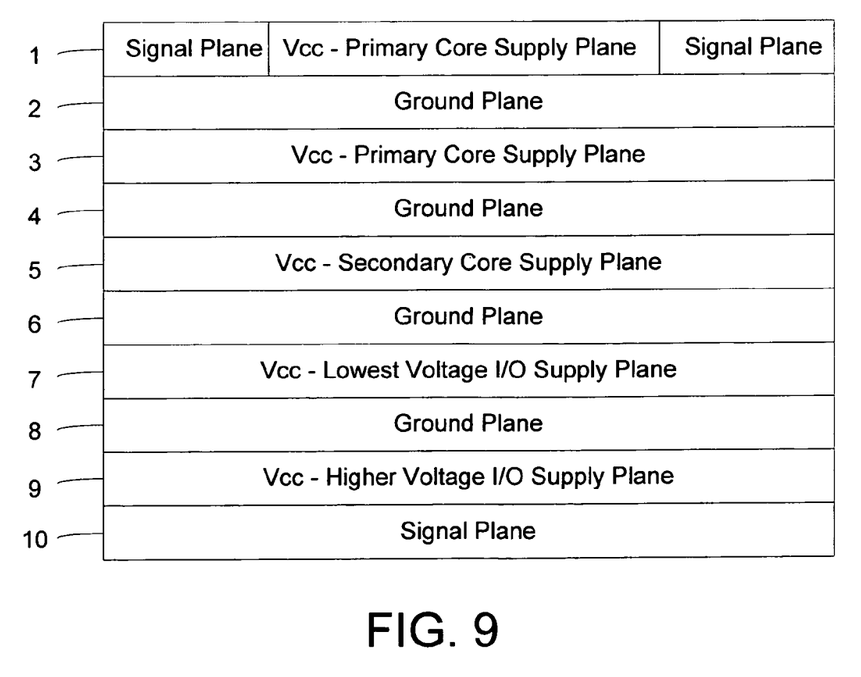
FIG. 9 shows an example controlled stackup for a ten-layer package substrate, according to embodiments of the present invention.

FIG. 9 shows an example controlled stackup for a ten-layer package substrate, according to embodiments of the present invention. The main primary core supply plane, shown as "Vcc—Primary Core Supply Plane" on plane 3 is placed on the supply plane closest to a die (not shown). In addition, "Vcc—Primary Core Supply Plane" can be placed in part on plane 1 in portions not used for routing signals. Bringing the primary core supply plane to plane 1 further reduces inductance to the die. Further, both core supply planes, shown as "Vcc—Primary Core Supply Plane" on plane 3 and "Vcc—Secondary Core Supply Plane" on plane 5, are closer to the die than any I/O supply planes. In this implementation, there are two I/O supply planes. The lowest voltage I/O supply plane, shown as "Vcc—Lowest Voltage I/O Supply Plane" on plane 7, is closest to the die of the I/O supply planes. Finally, the highest voltage I/O supply plane, shown as "Vcc—Higher Voltage I/O Supply Plane" on plane 9, is farthest from the die.

Figure 10:
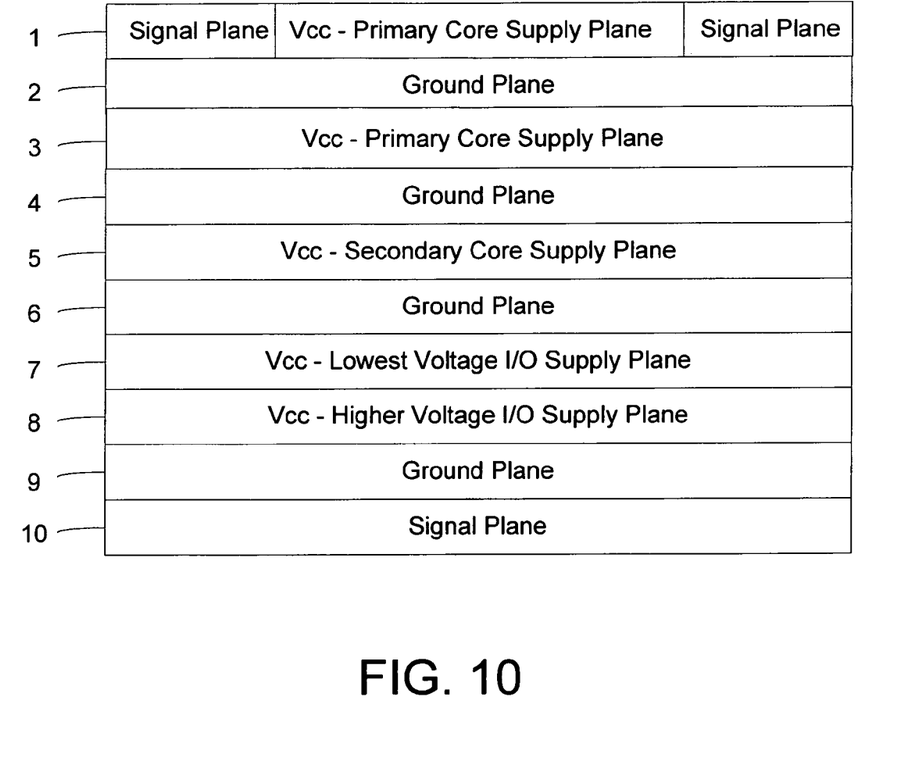
FIG. 10 shows an alternate example controlled stackup for a ten-layer package substrate, according to embodiments of the present invention.

FIG. 10 shows an alternate example controlled stackup for a ten-layer package substrate, according to embodiments of the present invention. The stackup in FIG. 10 is similar to FIG. 9 except that the order of "VCC—Higher Voltage I/O Supply Plane" and the adjacent ground plane on planes 8 and 9 has been swapped.

Although the present invention has been described above with particularity, this was merely to teach one of ordinary skill in the art how to make and use the invention. Although FIG. 5 shows two signal layers adjacent to each power/ground sandwich, other embodiments can have one or zero signal layers. Many additional modifications will fall within the scope of the invention, as that scope is defined by the following claims.

What is claimed is:

1. A method for arranging planes in a printed circuit board (PCB) to which is attached a semiconductor device, the PCB having stacked metal layers extending from a top surface for receiving the semiconductor device to a bottom surface, the method comprising:

placing one or more core voltage supply planes in one or more metal layers of the stacked metal layers of the PCB proximate to the semiconductor device, each core voltage supply plane of the one or more core voltage supply planes coupling a single core voltage supply to the semiconductor device, comprising:

placing a primary core voltage supply plane of the one or more core voltage supply planes in a first predetermined metal layer of the stacked metal layers nearest to the semiconductor device; and placing others of the one or more core voltage supply planes below the primary core voltage supply plane in descending order based on the amount of supply noise the circuitry of the semiconductor device can accept that is driven by each of the one or more core voltage supply planes; and placing one or more input/output (I/O) voltage supply planes below the one or more core voltage supply planes in one or more metal layers of the stacked metal layers below the first predetermined metal layer, each I/O voltage supply plane of the one or more I/O voltage supply planes coupling a single I/O voltage supply to the semiconductor device, comprising:

placing a lowest I/O voltage supply plane nearest to the one or more core voltage supply planes; and placing others of the one or more I/O voltage supply planes below the lowest I/O voltage supply plane in order of increasing voltage.

2. The method of claim 1:

wherein placing the one or more core voltage supply planes comprises supplying power to and connecting to the clock circuitry of the semiconductor device; and wherein placing the one or more I/O voltage supply planes comprises supplying power to and connecting to I/O circuitry of the semiconductor device.

3. The method of claim 1, further comprising:
assigning the third to last plane of the PCB to a highest voltage I/O voltage supply plane; and
assigning the second to last plane of the PCB to a ground plane.

4. The method of claim 1, further comprising:
placing a first ground plane proximate to a first side of each of the one or more core voltage supply planes and the one or more I/O voltage supply planes.

5. The method of claim 1, further comprising driving by the one or more core voltage supply planes the clock circuitry in the semiconductor device via conductive lines.

6. The method of claim 1, further comprising driving by the one or more I/O voltage supply planes the input/output circuitry of the semiconductor device via conductive lines.

7. The method of claim 4, further comprising:
placing a second ground plane proximate to a second side of each of the one or more core voltage supply planes and the one or more I/O voltage supply planes.

8. An arrangement of planes in a printed circuit board (PCB) to which is attached a semiconductor device, the PCB having stacked metal layers extending from a top surface for receiving the semiconductor device to a bottom surface, the PCB comprising:
one or more core voltage supply planes in one or more metal layers of the stacked metal layers of the PCB placed proximate to the semiconductor device, each core voltage supply plane of the one or more core voltage supply planes coupling a single core voltage supply to the semiconductor device, wherein:
a primary core voltage supply plane of the one or more core voltage supply planes is placed in a first predetermined metal layer of the stacked metal layers nearest to the semiconductor device; and
others of the one or more core voltage supply planes are placed below the primary core voltage supply plane in descending order based on the amount of supply noise the circuitry of the semiconductor device can accept that is driven by each of the one or more core voltage supply planes; and
one or more input/output (I/O) voltage supply planes placed below the one or more core voltage supply planes in one or more metal layers of the stacked metal layers below the first predetermined metal layer, each I/O voltage supply plane of the one or more I/O voltage supply planes coupling a single I/O voltage supply to the semiconductor device, wherein:
a lowest I/O voltage supply plane is placed nearest to the one or more core voltage supply planes; and
others of the one or more I/O voltage supply planes are placed below the lowest voltage I/O supply plane in order of increasing voltage.

9. The PCB of claim 8, wherein the one or more core voltage supply planes supply power to and are connected to the clock circuitry of the semiconductor device, while the one or more I/O voltage supply planes supply power to and are connected to I/O circuitry of the semiconductor device.

10. The PCB of claim 8, further comprising:
an assignment of the third to last plane of the PCB to a highest voltage I/O voltage supply plane; and
an assignment of the second to last plane of the PCB to a ground plane.

11. The PCB of claim 8, further comprising:
a first ground plane placed proximate to a first side of each of the one or more core voltage supply planes and the one or more I/O voltage supply planes.

12. The PCB of claim 8, further comprising conductive lines through which the one or more core voltage supply planes drive clock circuitry in the semiconductor device.

13. The PCB of claim 8, further comprising conductive lines through which the one or more I/O voltage supply planes drive input/output circuitry of the semiconductor device.

14. The PCB of claim 11, further comprising a second ground plane placed proximate to a second side of each of the one or more core voltage supply planes and the one or more I/O voltage supply planes.

15. An arrangement of planes in a package substrate to which a die is attached, the package substrate having stacked metal layers extending from a top surface to a bottom surface and comprising: a core voltage supply plane placed proximate to the die in a first predetermined metal layer and connected to supply power to the clock circuitry of the die, the core voltage supply plane coupling a single core voltage supply to the die; and an I/O voltage supply plane placed in a second predetermined metal layer below the -core voltage supply plane and connected to supply power to I/O circuitry of the die, the I/O voltage supply plane coupling a single core voltage supply to the die; wherein the core voltage supply plane and one or more other core voltage supply planes are placed proximate to and below the die in descending order based on the amount of supply noise the circuitry of the die can accept that is driven by each of the core voltage supply planes.

16. The package substrate of claim 15, wherein the I/O voltage supply plane and one or more other I/O voltages supply planes are placed below the core voltage supply plane in order of increasing voltage.

17. The package substrate of claim 15, further comprising:
conductive lines through which the core voltage supply plane drives clock circuitry in the die; and
conductive lines through which the I/O voltage supply plane drives input/output circuitry of the die.

* * * * *